MULTIPLE CRYSTAL FREQUENCY SELECTIVE MULTIPLIER

Filed Dec. 16, 1963

INVENTOR.
SAMUEL L. BROADHEAD JR.
BY
Moody and Kintzinger
ATTORNEYS 3,295,051

MULTIPLE CRYSTAL FREQUENCY SELECTIVE MULTIPLIER

Samuel L. Broadhead, Jr., Cedar Rapids, Iowa, assignor to Collins Radio Company, Cedar Rapids, Iowa, a corporation of Iowa Filed Dec. 16, 1963, Ser. No. 331,058
7 Claims. (Cl. 321—69)

Figure 1:
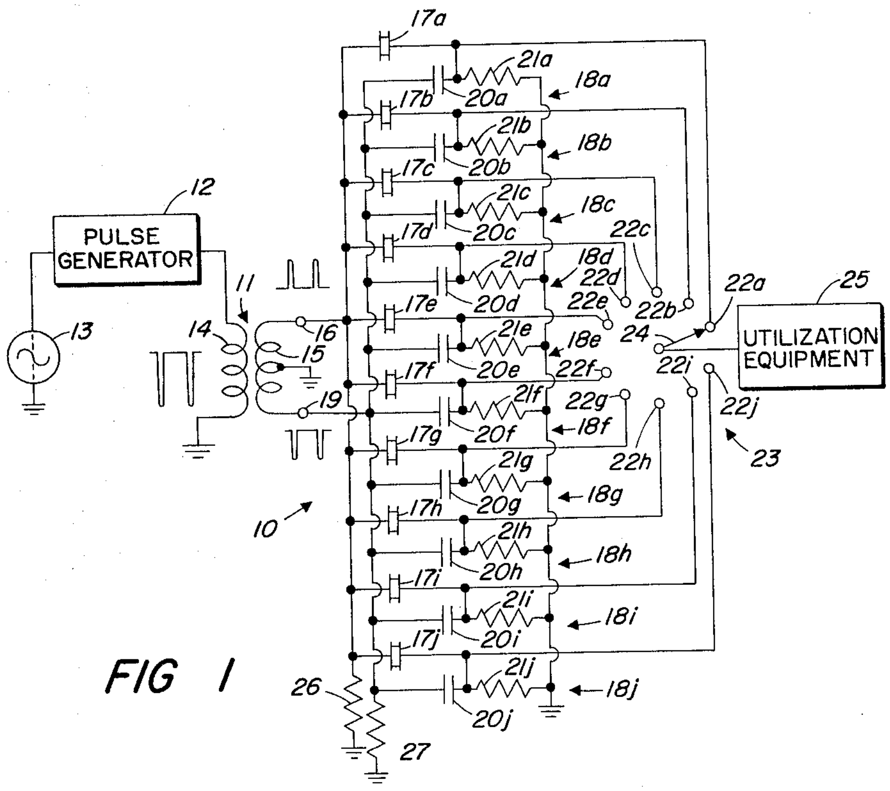

This invention relates in general to frequency multipliers, and in particular to a multiple crystal frequency selective multiplier capable of providing various desired harmonic output frequencies of a reference frequency as selected.

Many frequency generators and frequency multipliers encounter problems with selection of desired harmonic frequencies from among many frequencies and are troubled with insufficient rejection of undesired harmonics of a reference frequency or frequencies. Furthermore, many of these frequency multipliers and generating systems do not provide for individual filter compensation for different crystal shunt capacitances. In addition, many of the frequency generating and multiplying systems do not provide for individual filter bandwidth determination. Still further, there are problems of excessive variation in amplitudes between different harmonic outputs with many of the systems in the art.

It is, therefore, a principal object of this invention to provide a frequency multiplier providing a selection of desired harmonic outputs with maximum rejection of undesired harmonic frequencies.

Another object is to provide a multiple crystal frequency selective multiplier with individual filters adjusted for maximum rejection of undesired harmonics and with individual harmonic bandwith determination.

A further object is to provide a multiple crystal and individual filter output stabilized multiplier, having a selectable output, pulse activated from a common reference frequency source.

Still a further object is to maintain uniformity of amplitudes of harmonics within, for example, 6 db throughout the range of useful harmonic outputs generated and to accomplish this with narrow activating pulses from a common pulse generating reference frequency source with pulse widths less than one half cycle of the highest output harmonic frequency.

Features of this invention useful in accomplishing the above objects include a reference frequency source, a pulse generator connected for receiving the reference frequency and developing a pulse signal output. A pulse signal coil transformer is connected for developing opposite going pulses at the respective outputs of the secondary coil in response to the input pulses from the pulse generator. Each section of a battery of relatively narrow bandpass crystal filter sections has a crystal signal pulse input connection to one of the secondary coil terminals, and a capacitor signal pulse input connection to the other secondary coil terminal. Each of the filter sections in the battery of crystal filters has an individual terminating resistor and each individual crystal filter section is individually connected to switch means for selective individual connections as a frequency output through the switch to utilizing equipment.

Extremely narrow pulses must be developed in the pulse generator used with the multiple crystal frequency selective multiplier for proper operation. In fact, the pulses supplied by a pulse generator, as shown in the application, are less than one half cycle of the highest multiplier harmonic output frequency and are uniformly spaced to a very high degree of accuracy, to occur through the same portions of coinciding higher harmonic output frequency cycles, thereby minimizing, if not eliminating, any problems of phase jitter. Such a pulse generator has supplied pulses at 5 mc. for a multiple crystal frequency selective multiplier having a highest harmonic output of 55 mc. with the driving pulses out of the pulse generator less than $$\frac{1}{1.1\times10^8}$$

seconds (9.2 nanoseconds) wide. Such high frequency narrow trigger pulses have also been developed by similar pulse generators of my copending application S.N. 330,947, filed December 16, 1963, now Patent No. 3,270,214, and entitled "High Frequency Short Pulse Trigger Generator."

A specific embodiment representing what is presently regarded as the best mode for carrying out the invention is illustrated in the accompanying drawing.

Figure 2:
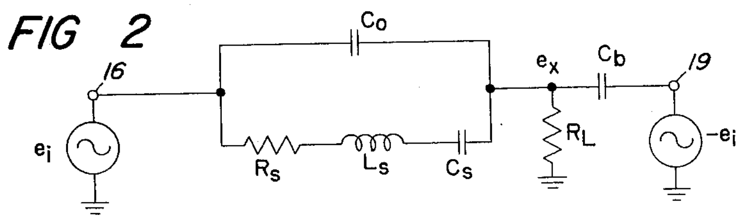
Figure 3:
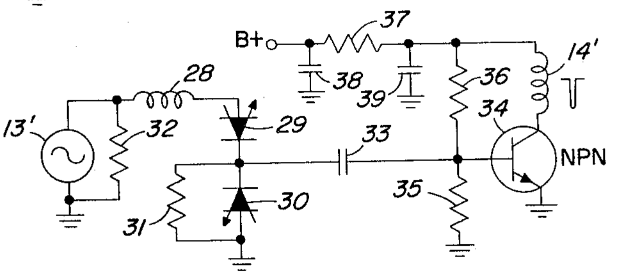

In the drawing:

FIGURE 1 represents a multiple crystal frequency selective multiplier of the invention, driven by the trigger pulse output of a pulse generator, connected to a reference frequency source;

FIGURE 2, a functional schematic equivalent of a crystal filter section of a multiple crystal frequency multiplier; and FIGURE 3, a high frequency narrow pulse generator for developing very narrow pulses at the reference frequency, and with the uniform pulse spacings required by proper operation of the crystal multiplier.

Referring to the drawing:

The multiple crystal frequency selective multiplier 10 of FIGURE 1 receives a high frequency narrow pulse input through coil transformer 11 from high frequency short pulse trigger generator 12. This narrow pulse signal is generated at the frequency received from reference frequency source 13. The very narrow pulses coupled from the primary coil 14 to the center tap grounded secondary coil 15, result in opposite going narrow synchronized pulses at the respective output terminals of the secondary coil 15.

The output terminal 16 of secondary coil 15 is connected in parallel to crystals 17*a* through 17*j* of crystal filter sections 18*a* through 18*j*. The other output terminal 19 of secondary coil 15 is connected in parallel to capacitors 20*a* through 20*j*. The other side of the crystals 17*a* through 17*j* and capacitors 20*a* through 20*j* are connected together by pairs, respectively, and in the respective filter sections through terminating resistors 21*a* through 21*j*, respectively, to ground. The common junction of each crystal and capacitor pair is also connected as an output connection to individual contacts 22*a* through 22*j*, respectively, of selectable switch 23. The movable arm 24 of switch 23 may be selectively connected to the respective crystal and capacitor filter sections 18*a* through 18*j* to provide a selected frequency output to utilizing equipment 25, as desired.

The secondary coil terminals 16 and 19 are also provided with connections to ground through resistors 26 and 27, respectively, in order to swamp out load variations with frequency change caused by the crystals in the crystal filter sections. Actually, the resistor 26 and 27 connections to ground would not be needed if transformer 11 were 100% efficient and the pulse source impedance were zero. The crystal, capacitor, and terminating resistor of each crystal filter section 18*a* through 18*j* is selected, respectively, for each respective predetermined harmonic frequency response to a predetermined frequency trigger pulse input, for individual filter compensation for the different crystal shunt capacitances, and with selected terminating resistors suitable individual filter section harmonic bandwidth determination.

The bank of crystal filter sections 18*a* through 18*j* utilizes the output of driving transformer 11, crystals 17*a* through 17*j*, bridge capacitors 20*a* through 20*j*, switch 23, and the terminating load resistors 21*a* through 21*j*. With this arrangement, transformer 11 supplies high frequency, very narrow trigger pulses at low impedance to the crystals 17*a* through 17*j* and capacitors 20*a* through 20*j* in opposite phase to provide an output from each filter section 18*a* through 18*j*, possible only through the respective resonant frequency range for each of the crystals 17*a* through 17*j*.

Please refer to FIGURE 2 for a functional schematic equivalent of one of the crystal filter sections 18*a* through 18*j*. The outputs of the transformer secondary coil 15 delivered to terminals 16 and 19, are indicated as being $e_i$ and $-e_i$ respectively, and $e_x$ is the voltage developed across load $R_L$ (one of the terminating resistors 21*a* through 21*j*). $C_o$ is the crystal shunt capacitance and $C_b$ is the balancing capacitance (one of the capacitors 20*a* through 20*j*) which is equal to $C_o$. $R_s$, $L_s$, and $C_s$ are series resistance, inductance, and capacitance, respectively, of the crystal (the respective crystal 17*a* through 17*j*).

Determination of the passband of the respective filters is facilitated by the following illustrative calculations and formulas. With off resonance, the path through $R_s$, $L_s$, and $C_s$ is of relatively very high impedance and $$e_x \cong \frac{e_i R_L}{R_L-(J\omega C_o)^{-1}} + \frac{-e_i R_L}{R_L-(J\omega C_o)^{-1}} \cong 0$$

With $R_s << (\omega C_o)^{-1}$ at the series resonant frequency of the crystal, $$2_x \cong \frac{e_i R_L}{R_s+R_L}$$

When the inductive component, $X_L$, of the crystal equals $$(J\omega C_o)^{-1} = -X_C, \text{ and } R_s << (\omega C_o)^{-1}$$

letting $$X = -X_C = X_L,\ e_x \cong 2Qe_i$$

Q being defined as $X/R_L$.

This is the highest value of $e_x$, and will occur between the series and parallel resonant frequencies of the crystal.

At the parallel resonant frequency of the crystal, it will be practically an open circuit, and $$e_x \cong \frac{-e_i R_L}{R_L-(J\omega C_b)^{-1}}$$

If $R_L=(\omega C_o)^{-1}$, $(Q=1)$, and $R_L >> R_s$, at the series resonant frequency of the crystal $e_x \cong e_i$, at the mid-frequency between series and parallel resonance, $e_x \cong 2e_i$, and at parallel resonance, $e_x \cong .7e_i$.

In a working embodiment as shown in FIGURE 1, with a 5 mc. reference frequency input to the pulse generator 12 from reference frequency source 13, the individual crystal frequency sections 18*a* through 18*j* have been arranged for providing selected frequency harmonic outputs of 10 through 55 mc. by precise 5 mc. steps as precise harmonic multiples of the basic reference frequency. In order that this may be accomplished, the pulse generator is required to produce relatively very narrow output trigger pulses at the frequency of the 5 mc. reference frequency. The driving trigger pulses passed to and through the transformer 11 from pulse generator 12 are less in width than one half cycle of the highest multiplier harmonic output frequency, and they are uniformly spaced to a very high degree of accuracy. With the trigger pulse width less than one half cycle of the highest crystal multiplier harmonic output frequency, the amplitude of the output harmonics of the multiplier 10 may be maintained with uniformity, for example, within 6 db through the range of useful harmonic outputs generated. Were the trigger pulse width to exceed more than one half cycle of the highest multiplier harmonic output frequency, part of the pulse power would be self-cancelling to quickly deteriorate output signal strength level. Further, the uniform spacing of the high frequency narrow trigger pulses minimizes, if not eliminates, the problem of phase jitter. A pulse generator 12 used with a multiple crystal frequency selective multiplier having a 5 mc. input and producing a highest harmonic output of 55 mc., the driving pulses out of the pulse generator have been less than $$\frac{1}{1.1 \times 10^8}$$

seconds (9.2 nanoseconds) wide. Such a high frequency short pulse trigger generator 12 is shown in FIGURE 3.

With reference to the pulse generator of FIGURE 3, there is shown a reference input signal source 13′ connected between ground and a coil 28 acting as a choke to the anode of a voltage variable capacitor (Varicap) 29. It should be noted, however, that some embodiments using a relatively high impedance signal source do not require impedance matching as provided by choke 28. The cathode of Varicap 29 is connected to the cathode of a second voltage variable capacitor (Varicap) 30, the anode of which is connected to ground. The common junction between Varicaps 29 and 30 is connected through resistor 31 to ground and a resistor 32 is connected between the junction of signal source 13′ and choke coil 28 and ground. Thus, a D.-C. circuit path is provided around each Varicap 29 and 30 from electrode to electrode with the component values chosen to give appropriate impedance for proper operation of the circuit. The resistor 32 could be replaced by a D.-C. circuit path through the signal source 13′ and, as a matter of fact, many various signal sources do have a through D.-C. circuit path as indicated in phantom through signal source 13 in FIGURE 1.

The voltage waveform developed at the common junction of Varicaps 29 and 30 is coupled through capacitor 33 to the base of NPN transistor 34. In order that NPN transistor 34 be biased for proper operation, its base is connected through resistor 35 to ground, the emitter is connected to ground, while a positive voltage supply B+ is connected through a voltage dividing network including resistors 36 and 35 to the base of transistor 34 and through coil 14′ to the collector of transistor 34. The connection from the positive voltage supply also includes a resistor 37 connected between the positive voltage supply and the common junction of resistor 36 and coil 14′. Resistor 37 is also part of a RF filter network including capacitors 38 and 39, useful for blocking RF from the B+ voltage supply. Coil 14′ may also be used as the pulse output coupling means to the secondary transformer coil 15 of the crystal multiplier 10.

Thus, it may be seen that this invention provides a very effective and efficient multiple crystal frequency selective multiplier, capable of providing various harmonic output frequencies, as desired, of a reference frequency.

Whereas this invention is here illustrated and described with respect to a specific embodiment thereof, it should be realized that various changes may be made without departing from the essential contributions to the art made by the teachings hereof.

I claim:

1. In a frequency multiplier, a reference frequency source; a pulse generator connected for receiving the reference frequency and developing a pulse signal output; a pulse transformer having a primary coil connected for receiving the pulse signal output of said pulse generator; a secondary coil of said pulse transformer having two output terminals connected for developing negative and positive going pulses at respective output terminals; one of said terminals being connected to multiple crystals each having a separate individual natural resonant frequency at a multiple of said reference frequency; multiple capacitors at least one paired with each of said crystals connected in parallel to the other of said secondary coil terminals; each pair of said crystals and capacitors being connected in common to one output terminal of multiple output terminals, and through impedance means to a voltage potential reference source; and means for selectively connecting the output terminals of said crystals to utilizing equipment.

2. In the frequency multiplier of claim 1, said impedance means including an individual impedance for each of said crystals connected between the respective crystals and a voltage potential reference source.

3. In the frequency multiplier of claim 2, wherein said multiple impedances comprise resistors.

4. In the frequency multiplier of claim 1, wherein said multiple capacitors are individually value selected for operation with its paired frequency crystal.

5. In the frequency multiplier of claim 1, wherein said pulse generator includes two voltage variable capacitors, each having a cathode and an anode and including a P-N junction which, when forwardly biased, permits the passage of current, and having the characteristics, when reverse biased, of blocking the flow of current, and with the P-N junction of each exhibiting capacitance as an inverse function of the reverse bias; an electrode of one of said voltage variable capacitors being connected for receiving the reference frequency from said reference frequency source, and having its other electrode connected in common with the corresponding electrode of the other voltage variable capacitor, the other electrode of the other voltage variable capacitor being connected to said voltage potential reference source; D.-C. path means around each of said voltage variable capacitors; means coupling the common junction of said voltage variable capacitors to an amplifying device having multiple electrodes including an output electrode; and means biasing said amplifying device to conduct predetermined portions of signal waveforms developed at the common junction of said voltage variable capacitors and coupled to said amplifying device.

6. The frequency multiplier of claim 5, wherein the amplifying device is a transistor having two P-N junctions; the means biasing said amplifying device includes a voltage supply having a polarity consistent with the orientation of the P-N junctions of the transistor, a connection of the transistor emitter to a voltage potential reference source, impedance means connected between the base of the transistor and said voltage potential reference source, and impedance means between said voltage supply and the collector of the transistor; and wherein the means coupling the common junction of said voltage variable capacitors to the amplifying device includes a connection through a capacitor from the common junction to the base of the transistor.

7. In the frequency multiplier of claim 5, the output electrode of said amplifying device being connected through the primary coil of said pulse transformer to a voltage supply.

References Cited by the Examiner

UNITED STATES PATENTS 3,054,968 9/1962 Harrison ____________ 331—76

JOHN F. COUCH, *Primary Examiner.*

G. GOLDBERG, *Assistant Examiner.*